US010845705B2

(12) United States Patent
Tiron et al.

(10) Patent No.: US 10,845,705 B2
(45) Date of Patent: Nov. 24, 2020

(54) METHOD FOR FORMING A CHEMICAL GUIDING STRUCTURE ON A SUBSTRATE AND CHEMOEPITAXY METHOD

(71) Applicant: COMMISSARIAT A L'ENERGIE ATOMIQUE ET AUX ENERGIES ALTERNATIVES, Paris (FR)

(72) Inventors: Raluca Tiron, Saint Martin le Vinoux (FR); Guillaume Claveau, Saint Martin de Bernegoue (FR); Ahmed Gharbi, Grenoble (FR); Laurent Pain, Saint Nicolas de Macherin (FR); Xavier Chevalier, Grenoble (FR); Christophe Navarro, Bayonne (FR); Anne Paquet, Annecy-le-Vieux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/227,101

(22) Filed: Dec. 20, 2018

(65) Prior Publication Data

US 2019/0196336 A1    Jun. 27, 2019

(30) Foreign Application Priority Data

Dec. 21, 2017    (FR) ...................... 17 62863

(51) Int. Cl.
*G03F 7/40*    (2006.01)
*G03F 7/00*    (2006.01)
(Continued)

(52) U.S. Cl.
CPC .......... *G03F 7/405* (2013.01); *B81C 1/00031* (2013.01); *G03F 7/0002* (2013.01);
(Continued)

(58) Field of Classification Search
CPC .... G03F 7/405; G03F 7/0002; G03F 7/70008; B81C 1/00031; B81C 2201/0149; H01L 21/02118; H01L 21/0271; H01L 21/0273
See application file for complete search history.

(56) References Cited

U.S. PATENT DOCUMENTS

2014/0116980 A1*   5/2014   Wuister ............... G03F 7/0002
                                                               216/11
2017/0069486 A1    3/2017   Pathangi

FOREIGN PATENT DOCUMENTS

WO    WO 2014/165530 A1    10/2014

OTHER PUBLICATIONS

Search Report as issued in French Patent Application No. 1762863, dated Aug. 7, 2018.

(Continued)

*Primary Examiner* — Timor Karimy
(74) *Attorney, Agent, or Firm* — Pillsbury Winthrop Shaw Pittman LLP

(57) ABSTRACT

A method for forming a chemical guiding structure intended for self-assembly of a block copolymer by chemoepitaxy, where the method includes forming on a substrate a functionalisation layer made of a first polymer material having a first chemical affinity with respect to the block copolymer; forming on the substrate guiding patterns made of a second polymer material having a second chemical affinity with respect to the block copolymer, different from the first chemical affinity, and wherein the guiding to patterns have a critical dimension of less than 12.5 nm and are formed by means of a mask comprising spacers.

10 Claims, 5 Drawing Sheets

(51) Int. Cl.
  *G03F 7/20* (2006.01)
  *H01L 21/02* (2006.01)
  *H01L 21/027* (2006.01)
  *B81C 1/00* (2006.01)

(52) U.S. Cl.
  CPC ...... *G03F 7/70008* (2013.01); *H01L 21/0271* (2013.01); *H01L 21/0273* (2013.01); *H01L 21/02118* (2013.01); *B81C 2201/0149* (2013.01)

(56) References Cited

OTHER PUBLICATIONS

Liu, C.-C., et al., "Integration of block copolymer directed assembly with 193 immersion lithography," Journal of Vacuum Science and Technology, Part B, vol. 28, No. 6, Nov. 2010, XP012144322, pp. C6B30-C6B34.

Kim, S. O., et al., "Epitaxial self-assembly of block copolymers on lithography defined nanopatterned substrates," letters to nature, vol. 424, Jul. 2003, pp. 411-414.

* cited by examiner

METHOD FOR FORMING A CHEMICAL GUIDING STRUCTURE ON A SUBSTRATE AND CHEMOEPITAXY METHOD

CROSS-REFERENCE TO RELATED APPLICATIONS

This application claims priority to French Patent Application No. 1762863, filed Dec. 21, 2017, the entire content of which is incorporated herein by reference in its entirety.

FIELD

The present invention concerns a method for forming a chemical guiding structure is intended for the self-assembly of a block copolymer by chemoepitaxy. The present invention also concerns a method of chemoepitaxy from a chemical guiding structure.

BACKGROUND

Directed self-assembly (DSA) of block copolymers is an emergent lithography technique enabling patterns of critical dimension smaller than 30 nm to be formed. This technique constitutes a less costly alternative to extreme ultraviolet lithography (EUV) and to electron beam lithography ("e-beam").

The known methods of self-assembly of block copolymers can be divided into two categories: graphoepitaxy and chemoepitaxy.

Graphoepitaxy consists in forming primary topographic patterns called guides on the surface of a substrate, these patterns delimiting areas inside of which a block copolymer layer is deposited. The guiding patterns enable the organisation of the copolymer blocks to be controlled, to form secondary patterns of higher resolution inside these areas.

Chemoepitaxy consists in modifying the chemical properties of certain regions of the surface of the substrate, to guide the organisation of the block copolymer which is then deposited on this surface. Chemical modification of the substrate can be obtained, in particular, by grafting a polymer neutralisation layer. This neutralisation layer is then structured in order to create a chemical contrast at the surface of the substrate. The regions of the substrate not covered by the neutralisation layer thus have a preferential chemical affinity for one of the copolymer blocks, whereas the regions of the substrate covered by the neutralisation layer have an equivalent chemical affinity for all the blocks of the copolymer. Patterning of the neutralisation layer is conventionally obtained by a step of optical or electron beam lithography.

To guarantee assembly of the block copolymer with minimal organisational defects, the regions of the substrate having a preferential affinity for one of the blocks are typically of width W equal to the width of the block copolymer domain, the latter being equal to half natural period $L_0$ of the copolymer ($W=0.5*L_0$) or equal to one and a half times this natural period ($W=1.5*L_0$). In addition, the regions of the substrate having a preferential affinity are typically separated two-by-two by a distance $L_s$ equal to an integer multiple of period $L_0$ ($L_s=n*L_0$, where n is a natural non-zero integer called the pitch multiplication factor).

The article of C-C. Liu et al. entitled ["Integration of block copolymer directed assembly with 193 immersion lithography", J. Vac. Sci. Technol., B 28, C6B30-C6B34, 2010] describes a chemoepitaxy method comprising formation of a chemical guiding structure on the surface of a substrate. The chemical guiding structure is comprised of guiding patterns of a polymer with a preferential affinity for one of the copolymer blocks and a random copolymer film grafted on to the substrate outside the patterns, in a region called the background region. The random copolymer is neutral with respect to the block copolymer, such that the domains of the copolymer are (after assembly) oriented perpendicularly to the substrate. The chemical guiding structure is intended to direct the self-assembly of block copolymer PS-b-PMMA (polystyrene-block-polymethylmethacrylate). The guiding patterns, in the form of lines, are comprised of cross-linked polystyrene (X-PS). The random copolymer, grafted between the lines, is PS-r-PMMA.

With reference to FIG. 1, this chemoepitaxy method comprises firstly the formation of a cross-linked polystyrene film 11 on a silicon substrate 10. A mask comprised of resin patterns 12 is then formed on cross-linked polystyrene film 11, by optical lithography (typically of the 193 nm immersion type). The dimensions of resin patterns 12 are then reduced by a step of oxygen-based plasma in order to obtain a width W of the order of a half period of the block copolymer. During this step, cross-linked polystyrene film 11 is also etched through mask 12 by the plasma. This etching step is commonly called a "trim etch". Cross-linked polystyrene patterns, in the form of parallel lines 11', are thus formed on substrate 10. After the step of "trim etching", polystyrene lines 11' have a width W equal to 15 nm and are separated two-by-two by a distance $L_s$ equal to 90 nm. After removing resin mask 12, substrate 10 is covered with a solution comprising the graftable random copolymer, the random copolymer is then grafted between lines 11' to form a neutralisation layer 13. Finally, a layer of PS-b-PMMA 14 is deposited and then assembled on the guiding structure comprised of polystyrene lines 11' and neutralisation layer 13.

This chemoepitaxy method gives satisfactory results with regard to the assembly of block copolymer PS-b-PMMA with, in particular, a low rate of defects. It is not however compatible with new-generation block copolymers, called "high-X", which have a natural period $L_0$ shorter than that of PS-b-PMMA, since the latter require guiding patterns of a very low critical dimension, typically less than 12.5 nm. The combination of a step of optical lithography (typically of the 193 nm immersion type) and an additional "trim etching" step, does not enable guiding patterns of such a low critical dimension to be created, in a manner which is reproducible at the scale of the substrate, in particular when they are high density. High variability is indeed observed in the dimensions of guiding patterns and this affects the assembly of the block copolymers, causing a large number of defects. A possible solution would be extreme ultraviolet (EUV) lithography, but the lack of technical maturity of this technique and its very high cost make its application difficult.

SUMMARY

There is therefore a need to provide a method for forming a chemical guiding structure on a substrate, which is compatible with new-generation block copolymers and which allows satisfactory dimensional control of the guiding patterns, whatever their distribution on the substrate.

According to an aspect of the invention, this need tends to be satisfied by providing a method for forming a chemical guiding structure intended for self-assembly of a block copolymer by chemoepitaxy, this method comprising the following steps:

forming on a substrate a functionalisation layer made of a first polymer material having a first chemical affinity with respect to the block copolymer;

forming on the substrate guiding patterns made of a second polymer material having a second chemical affinity with respect to the block copolymer, different from the first chemical affinity;

and wherein the guiding patterns have a critical dimension of less than 12.5 nm and are formed by means of a mask comprising spacers.

Thanks to the spacers it is possible to attain critical dimensions compatible with new-generation block copolymers called "high-X". The use of spacers also guarantees satisfactory control of the dimensioning of the guiding patterns, whatever their distribution on the substrate. In particular, the guiding patterns formed by means of the spacers have a line edge roughness and a width edge roughness which are lower than in the prior art, enabling a higher quality assembly of the copolymer to be obtained, and therefore, ultimately, improved electrical performance.

These benefits result from the fact that the spacers themselves have excellent performance in terms of reproducibility, due to the manner in which they are formed. Formation of the spacers beneficially comprises a step of conformal deposit of a sacrificial material layer on a topographic pattern (i.e. a recessed or protruding pattern) and a step of anisotropic etching of the sacrificial material layer, in a desired etching direction perpendicular to the substrate.

In an embodiment, the first chemical affinity is equivalent for each of the copolymer blocks and the second chemical affinity is preferential for one of the blocks of the copolymer.

In a first embodiment of the invention, the method of formation comprises the following steps:
forming the functionalisation layer on the substrate;
depositing a layer of sacrificial material on the functionalisation layer;
forming in the layer of the sacrificial material and in the functionalisation layer cavities opening on to the substrate, each cavity comprising a bottom and side walls;
forming the spacers against the side walls of the cavities;
grafting the second polymer material on to the bottoms of the cavities between the spacers;
removing the spacers and the layer of sacrificial material.

In a second embodiment of the invention, the method of formation comprises the following steps:
forming a layer of the second polymer material on the substrate;
forming the spacers on the layer of the second polymer material;
etching the layer of the second polymer material through the spacers to form the guiding patterns;
grafting the first polymer material on to the substrate outside the guiding patterns to form the functionalisation layer; and
removing the spacers.

According to a development of the second embodiment, the method also comprises a step of modification of the first chemical affinity in only a portion of the functionalisation layer by exposure to ultraviolet radiation (UV).

In an embodiment, the exposure to UV radiation is performed over the entire surface of the substrate before the step of removing the spacers, the UV radiation has a wavelength comprised between 150 nm and 350 nm, and the spacers are separated two-by-two by a distance of less than or equal to half the wavelength.

According to another development of the second embodiment, the mask comprises at least two spacers of critical dimension substantially equal to half the natural period of the block copolymer. The spacers are further separated two-by-two and center to center by a distance substantially equal to an integer multiple of the natural period of the block copolymer.

Beneficially, the critical dimension of the guiding patterns is further substantially equal to half the natural period of the block copolymer.

An aspect of the invention also concerns a chemoepitaxy method comprising the formation of a chemical guiding structure on a substrate by means of the method of formation described above, the deposition of a block copolymer on the chemical guiding structure and assembly of the block copolymer.

The block copolymer is beneficially a copolymer of natural period of less than 25 nm, chosen from, in an embodiment, among the following ones:
PS-b-PMMA: polystyrene-block-polymethylmethacrylate, of which at least one of the two blocks is chemically modified;
PS-b-PDMS: polystyrene-block-polydimethylsiloxane;
PS-b-PLA: polystyrene-block-polylactic acid;
PS-b-PEO: polystyrene-block-ethylene polyoxide;
PS-b-PMMA-b-PEO: polystyrene-block-polymethylmethacrylate-block-ethylene polyoxide;
PS-b-P2VP: polystyrene-block-poly(2vinylpyridine);
PS-b-P4VP: polystyrene-block-poly(4vinylpyridine);
PS-b-PFS: poly(styrene)-block-poly(ferrocenyldimethylsilane);
PS-b-PI-b-PFS: poly(styrene)-block-poly(isoprene)-block-poly(ferrocenyldimethylsilane);
PS-b-P(DMS-r-VMS): polystyrene-block-poly(dimethylsiloxane-r-vinylmethylsiloxane);
PS-b-PMAPOSS: polystyrene-block-poly(methyl acrylate)POSS;
PDMSB-b-PS: poly(1,1-dimethylsilacyclobutane)-block-polystyrene;
PDMSB-b-PMMA: poly(1,1-dimethylsilacyclobutane)-block-poly(methyl methacrylate);
PMMA-b-PMAPOSS: poly(methyl methacrylate)-block-poly(methyl acrylate)POSS;
P2VP-b-PDMS: poly(2-vinylpyridine)-block-poly(dimethyl siloxane);
PTMSS-b-PLA: poly(trimethylsilylstyrene)-block-poly(D,L-lactide);
PTMSS-b-PDLA: poly(trimethylsilylstyrene)-block-poly(D-lactic acid);
PTMSS-b-PMOST: poly(trimethylsilylstyrene)-block-poly(4-methoxystyrene);
PLA-b-PDMS: poly(D,L-lactide)-block-poly(dimethylsiloxane);
PAcOSt-b-PSi2St: poly(4-acetoxystyrene)-block-poly(4-(Bis(trimethylsilyl)methyl)styrene);
1,2-PB-b-PDMS: 1,2-polybutadiene-block-poly(dimethyl siloxane);
PtBS-b-PMMA: poly(4-tert-butylstyrene)-block-poly(methyl methacrylate);
PCHE-b-PMMA: polycyclohexane-block-poly(methyl methacrylate);
MH-b-PS: maltoheptaose-block-polystyrene.

BRIEF DESCRIPTION OF THE FIGURES

Other characteristics and benefits of the invention will become clear from the description which is given of it below, by way of example and non-restrictively, with reference to the appended figures, in which.

For greater clarity, identical or similar elements are identified by identical reference signs in all the figures.

DETAILED DESCRIPTION

The method described below in relation with FIGS. 2A-2F, 4A-4G and 6 enables a chemical guiding structure to be formed on a face of a substrate 100. A chemical guiding structure refers in this case to a set of at least two polymer patterns placed on separate regions of substrate 100 and having different chemical affinities, this set being repeated periodically on the surface of the substrate. A chemical contrast is thus created on the surface of the substrate. Substrate 100 is for example made of silicon. Substrate 100 can have a chemical affinity identical to one of the two polymer patterns.

This chemical guiding (or contrast) structure is intended to be covered with a block copolymer, as part of a method of directed self-assembly of a block copolymer by chemoepitaxy. The chemical contrast enables the organisation of the monomer blocks that form the copolymer to be directed (or "guided"). The chemical affinities of the polymer patterns are thus understood with respect to the blocks of the copolymer. These affinities can be chosen from among the following possibilities:

preferential affinity for any of the blocks of the copolymer; or neutral, i.e. with an equivalent affinity for each of the copolymers blocks.

There can be a small difference of thickness, typically less than 10 nm, between the patterns of the chemical guiding structure or between the substrate and the patterns. However, this difference of thickness, forming a topographical contrast, has no negative impact on the assembly of the block copolymer.

Figure 1:
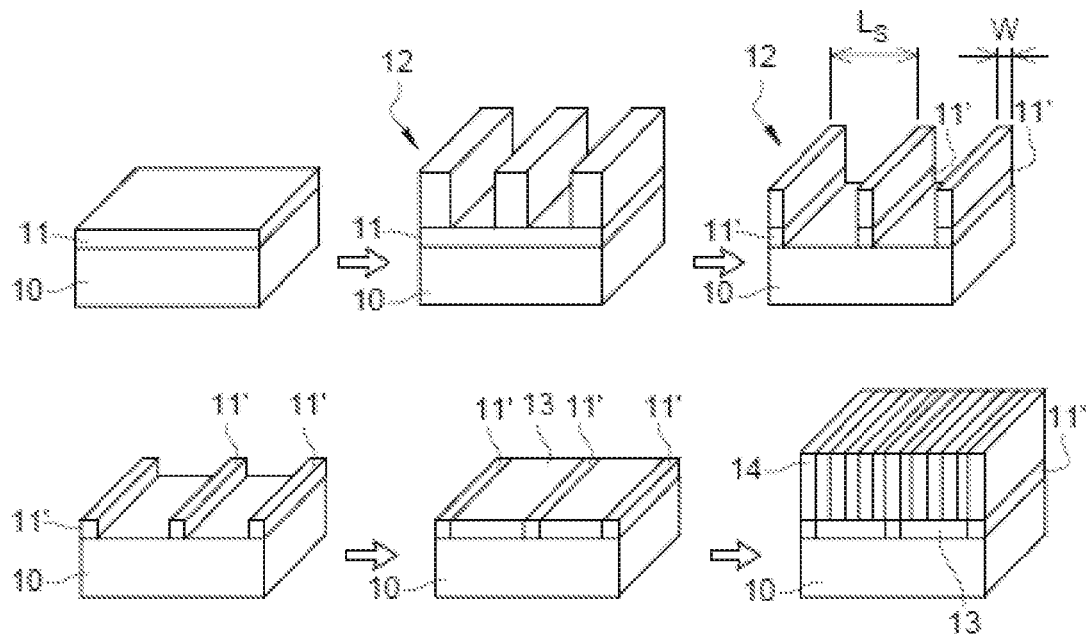
FIG. 1, previously described, represents steps of a chemoepitaxy method according to the prior art.
Figure 2A:
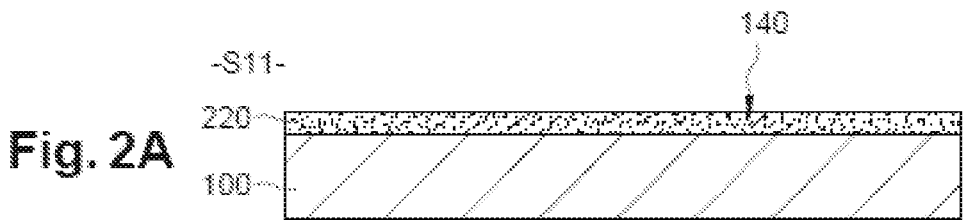
FIGS. 2A to 2F represent steps of a method for forming a chemical guiding structure, according to a first embodiment of the invention.
Figure 2B:
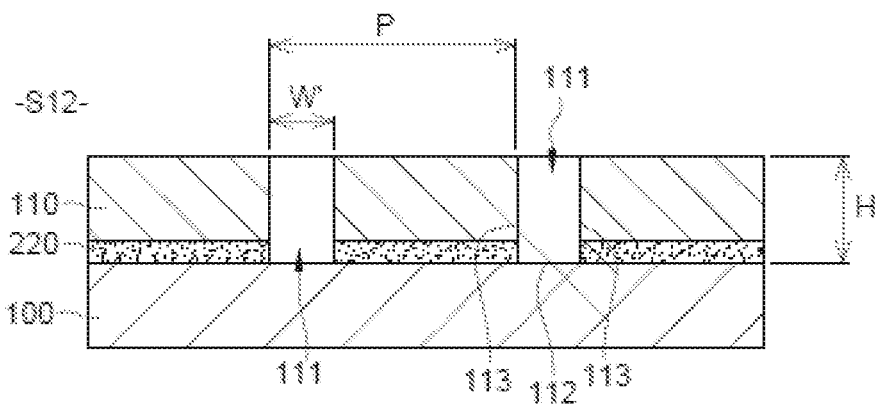
Figure 2C:
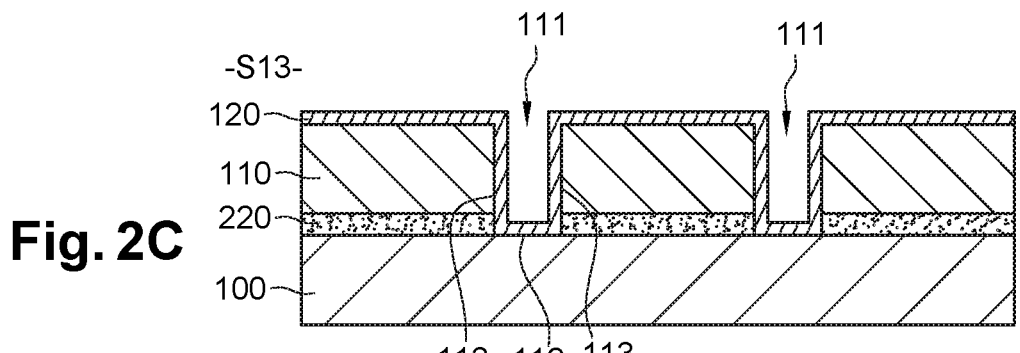
Figure 2D:
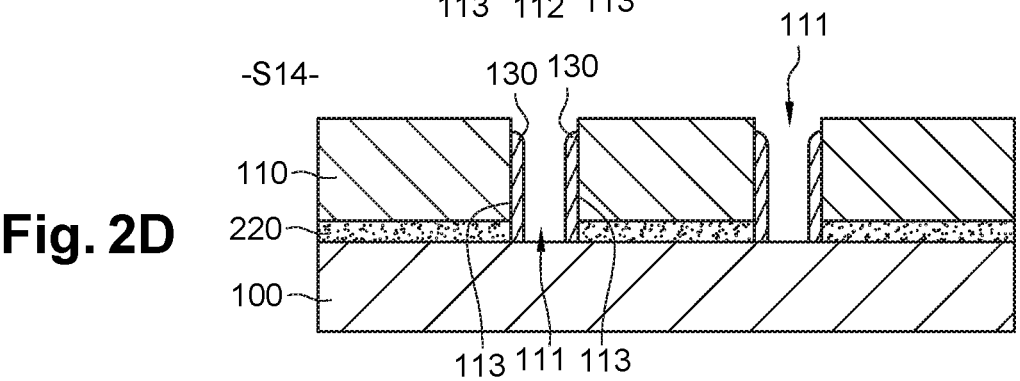
Figure 2E:
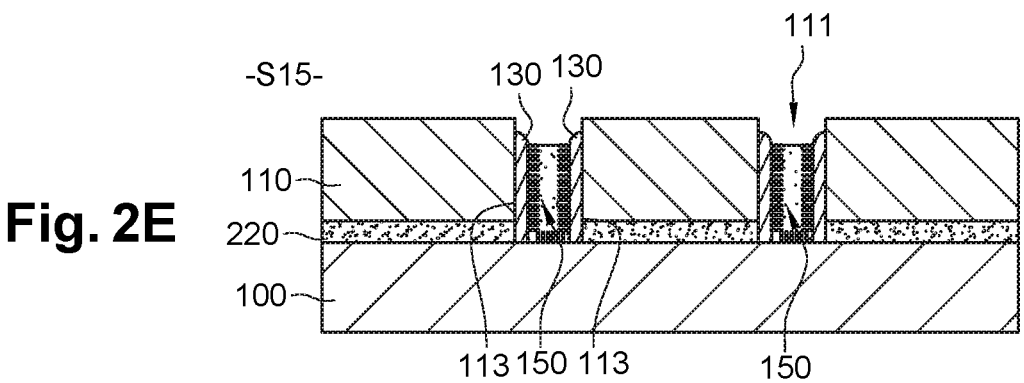
Figure 2F:
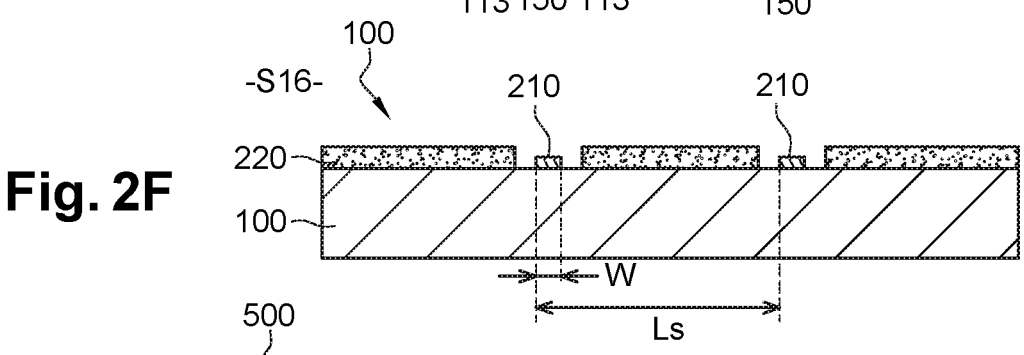
Figure 4A:
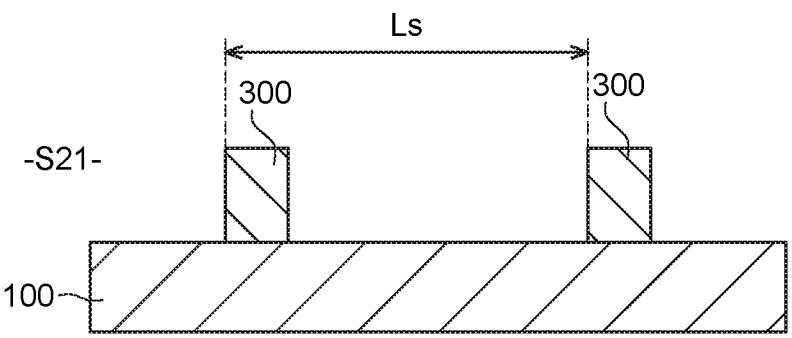
FIGS. 4A to 4G represent steps of a method for forming a chemical guiding structure, according to a second embodiment of the invention.
Figure 4B:
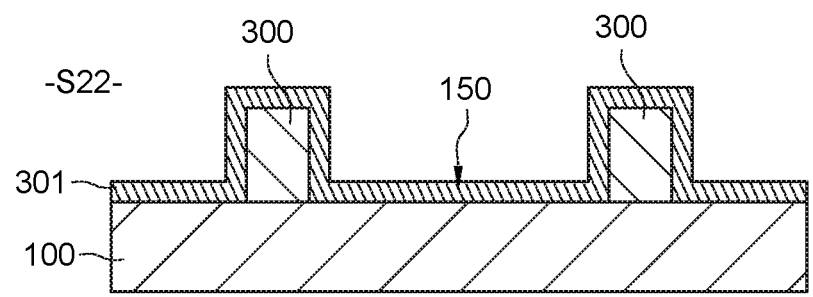
Figure 4C:
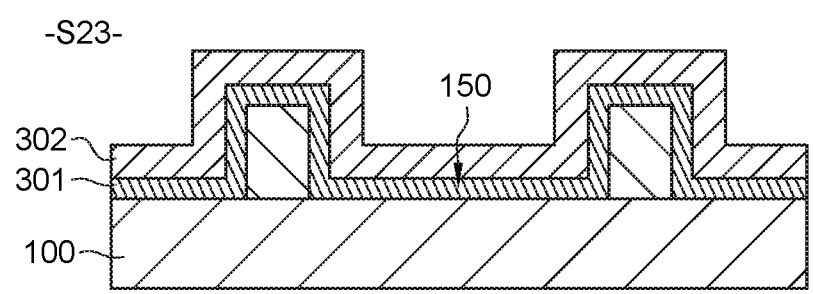
Figure 4D:
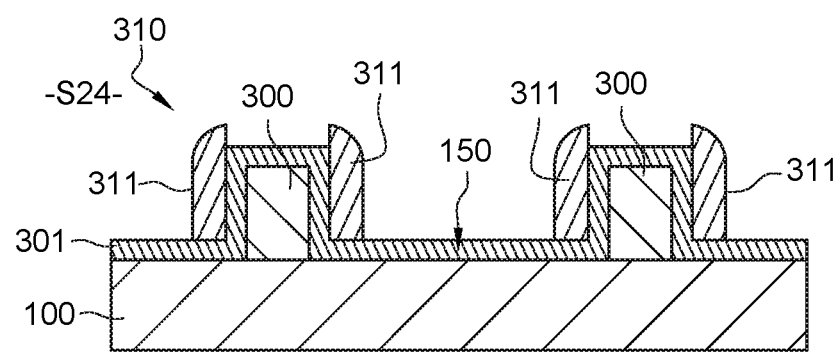
Figure 4E:
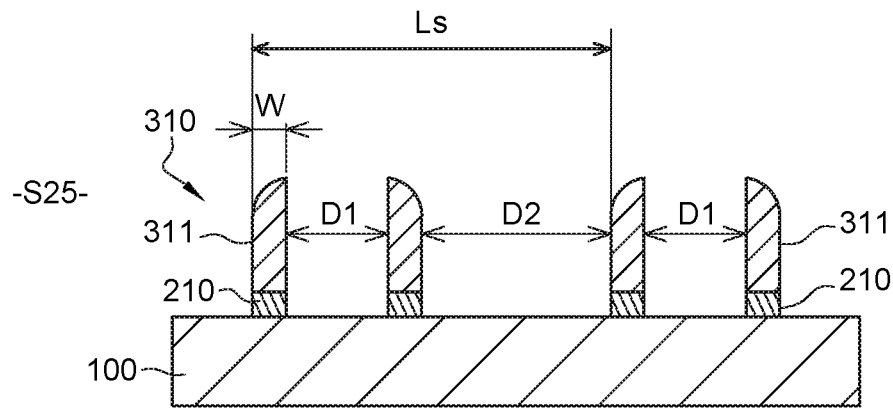
Figure 4F:
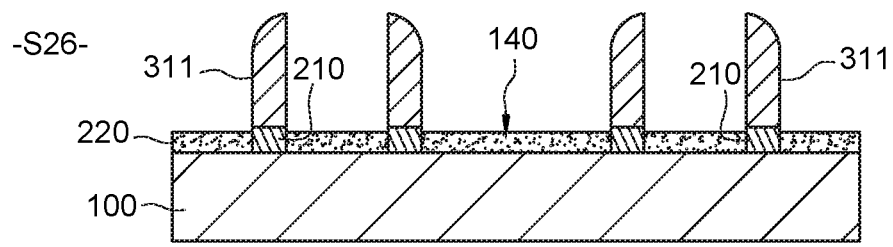
Figure 4G:
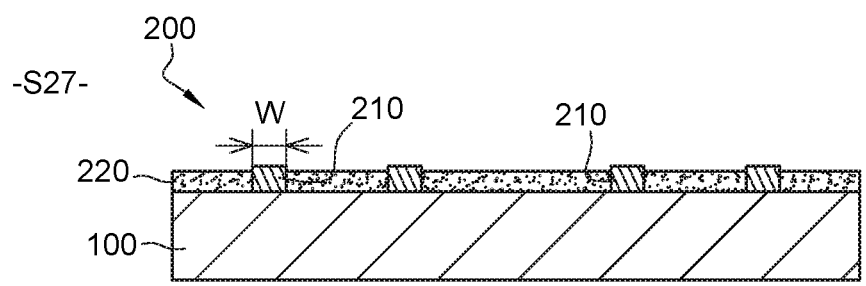
Figure 6:
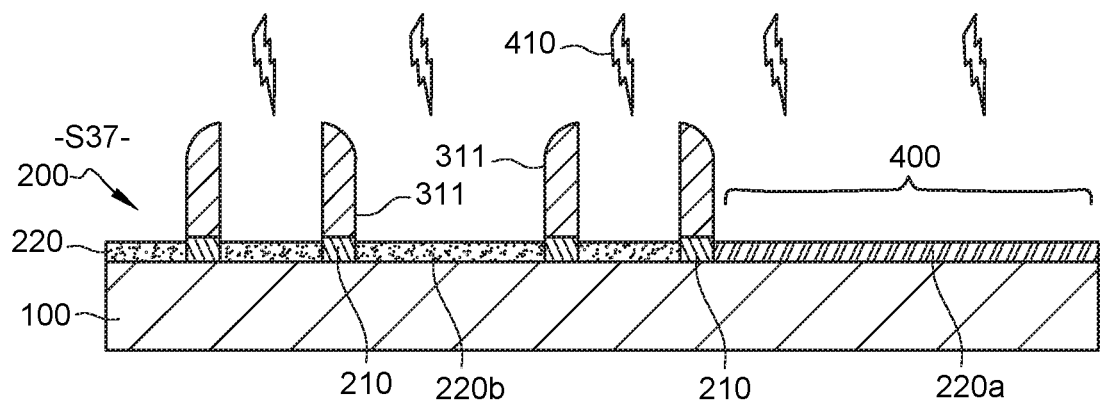
FIG. 6 represents an additional optional step of the method of FIGS. 4A-4G.

With reference to FIGS. 2F, 4G and 6, guiding structure 200 comprises several guiding patterns 210 and a neutralisation layer 220. Neutralisation layer 220 occupies at least one region of the surface of substrate 100 devoid of guiding patterns 210, and in certain embodiments of the method it occupies the entire surface of substrate 100 outside guiding patterns 210 (cf. FIGS. 4G & 6).

The role of guiding patterns 210 and neutralisation layer 220 is to functionalise chemically (and differently) substrate 100. They can also be qualified as functionalisation patterns and a functionalisation layer. Guiding patterns 210 are formed from a polymer with a preferential affinity for one of the blocks of the copolymer, while neutralisation layer 220 consists of a polymer with a neutral affinity. Guiding patterns 210 have, in an embodiment, a critical dimension W substantially equal to half natural period $L_0$ of the block copolymer ($W=L_0/2\pm10\%$).

In the following description, the term "grafting" of a polymer on a substrate is understood to mean the formation of covalent links between the substrate and the chains of the polymer. As a comparison, cross-linking of a polymer implies the formation of several links between the chains of the polymer.

FIGS. 2A to 2F are cross-section views illustrating steps S11 to S16 of the method for forming a chemical guiding structure, according to a first embodiment of the invention.

First step S11 of the method, illustrated by FIG. 2A, consists in forming neutralisation layer 220 on the surface of substrate 100. Neutralisation layer 220 has, in an embodiment, a substantially constant thickness, for example between 2 nm and 15 nm, and occupies the entire surface of substrate 100. Neutralisation layer 220 is comprised of a first polymer 140 having neutral affinity. This first polymer 140 is in an embodiment a random copolymer comprised of the same monomers as the block copolymer envisaged for the chemoepitaxy method. For example, when the block copolymer is PS-b-PMMA (at least one of the blocks of which has been modified) of lamellar morphology, neutralisation layer 220 can be formed of the random copolymer PS-r-PMMA (with the same modified block), for example comprising 50% by mass of polystyrene (PS) and 50% by mass of methyl polymethacrylate (PMMA). Neutralisation layer 220 can also be a self-assembled monolayer (also called SAM for "Self-Assembled Monolayer").

First polymer 140 of neutralisation layer 220 is beneficially a graftable material. Step S11 of forming neutralisation layer 220 then comprises the deposition on substrate 100 of a first solution containing the first graftable polymer, for example by centrifugation (also called "spin-coating"). The first solution is prepared by diluting first polymer 140 in an organic solvent, for example propylene glycol methyl ether acetate (PGMEA). The deposition of the first solution is followed by an operation to graft first polymer 140 on substrate 100, in an embodiment by annealing. The annealing is, for example, performed at a temperature equal to 250° C., for a period equal to 10 minutes, on a heating plate or in a furnace. An operation of rinsing using a solvent (e.g. PGMEA) then enables first polymer 140 which has not been grafted to be eliminated.

Alternatively, first polymer 140 can be a cross-linkable material. After the first solution is spread by centrifugation, first polymer 140 is cross-linked by annealing or by exposure to UV rays. As with the grafting operation, the cross-linking operation is beneficially followed by rinsing using a solvent.

Step S12 of FIG. 2B comprises the deposition of a first layer 110 made of sacrificial material on neutralisation layer 220 and the formation of cavities 111 in first layer 110 and neutralisation layer 220. For the sake of clarity, only two of these cavities 111 have been represented in FIG. 2B.

Each cavity 111 has a bottom 112 and side walls 113 extending in a direction secant to the surface of substrate 100. Side walls 113 may extend in a direction perpendicular to the surface of substrate 100. Besides, each cavity 111 opens on to the surface of substrate 100. In other words, bottom 112 of cavity 111 consists of substrate 100, the surface of which is beneficially flat.

Each cavity 111 may have a depth H comprised between 30 nm and 150 nm and a width W' comprised between 30 nm and 60 nm. Depth H of a cavity is measured perpendicular to the surface of substrate 100, whereas width W' of the cavity is measured parallel to the surface of substrate 100 in the section plane of FIG. 2B.

When first layer 110 comprises several cavities 111, these cavities do not necessarily have the same dimensions, nor the same geometry. Cavities 111 can in particular take the form of a trench, a cylindrical well or a well of rectangular section.

As an example, cavities 111 are rectilinear trenches, of identical dimensions and oriented parallel with one another. The also form a periodic structure, i.e. they are spaced regularly. Period P of this structure is in an embodiment between 60 nm and 140 nm.

The sacrificial material of first layer 110 is in an embodiment chosen from among the materials which can be easily removed by wet etching and/or by dry etching, in a selective manner with respect to substrate 100. As an example, silicon dioxide ($SiO_2$), hydrogen silsesquioxane (HSQ) and silicon nitride ($Si_3N_4$) can be cited. Alternatively, first layer 110 of sacrificial material can be formed of a silicon-containing anti-reflective coating (SiARC).

Cavities 111 can be formed by photolithography or other patterning techniques, such as electron beam lithography ("e-beam"). In the case of photolithography, for example of the immersion type with a wavelength of 193 nm, the formation of cavities 111 can in particular comprises the following operations:
- deposition on first layer 110 of a resin layer or of several layers intended to form a hard mask, for example a stack of three layers comprising successively a carbonaceous layer deposited by centrifugation ("Spin On Carbon", SOC), a silicon-containing anti-reflective coating (SiARC) and a resin layer;
- creation of apertures in the resin layer and, if applicable, transfer of the apertures into the layers underlying the hard mask (step of opening of the mask); and
- selective etching of first layer 110 and of neutralisation layer 220 through the resin mask or the hard mask, substrate 100 being insensitive to etching or protected by a layer insensitive to etching.

First layer 110 and neutralisation layer 220 are beneficially etched anisotropically, for example by means of a plasma. An anisotropic etching technique provides better control of the dimensions of cavities 111.

The method then comprises the formation of spacers against side walls 113 of cavities 111, to reduce width W' of the cavities beyond the limit of resolution of photolithography, up to a value of less than 12.5 nm. These spacers can be produced in two successive steps S13 and S14, represented respectively by FIGS. 2C and 2D.

With reference to FIG. 2C, a second layer 120 made of sacrificial material is deposited in a conformal manner on substrate 100 covered with neutralisation layer 220 and first layer 110. Second layer 120 is thus of constant thickness and follows the relief formed on the surface of substrate 100. Second layer 120 is in an embodiment between 5 nm and 25 nm thick. The conformal deposition technique used to deposit second layer 120 is for example atomic layer deposition (ALD), possibly enhanced by plasma (PEALD, "Plasma Enhanced Atomic Layer Deposition").

The sacrificial material of second layer 120 can in particular be chosen from among silicon dioxide ($SiO_2$), silicon oxynitride ($SiO_xN_y$), alumina ($Al_2O_3$) and hafnium dioxide ($HfO_2$). It is not therefore necessarily identical to the sacrificial material of first layer 110.

With reference to FIG. 2D, second layer 120 is then etched anisotropically, in an embodiment by means of a plasma (for example a fluorocarbon plasma). The preferential etching direction is perpendicular to the surface of substrate 100. This step of anisotropic etching enables only the horizontal portions of second layer 120, positioned above first layer 110 and on the bottoms of cavities 111, to be eliminated.

The vertical portions of second layer 120, arranged against side walls 113 of cavities 111, are retained, and constitute spacers 130.

The etching of second layer 120 is selective with respect to substrate 100 and to first layer 110. The material of the substrate is in an embodiment insensitive to the etching of the sacrificial material. In the contrary case, a specific layer can be provided to protect substrate 100 from the etching.

During these steps S13 and S14, first layer 110 made of sacrificial material protects neutralisation layer 220. There is therefore no risk that the chemical affinity of neutralisation layer 220 will be modified by the deposition plasma (PEALD) or the etching plasma.

In step S15 of FIG. 2E, a second polymer 150 with a preferential affinity for one of the copolymer blocks is grafted on to substrate 100 at the bottoms of cavities 111, in regions located between spacers 130. To accomplish this, second polymer 150 can be dissolved in a solvent to form a second polymer solution, and this second solution is then deposited on substrate 100 until cavities 111 are partially or completely filled. The second polymer solution is in an embodiment deposited on substrate 100 by centrifugation. The grafting is then accomplished, for example by annealing, using the same technique as that described in relation to FIG. 2A. A portion of second polymer 150 in solution then attaches to substrate 100 at the bottoms of cavities 111 and, superfluously, at the surface of spacers 130. As above, the grafting is beneficially followed by an operation of rinsing using solvent.

First layer 110 and spacers 130 made of sacrificial material thus act as a mask or template to locate the grafting of second polymer 150 on substrate 100.

Second polymer 150 is in an embodiment a homopolymer of the same composition as one of the copolymer blocks, for example a polystyrene homopolymer (h-PS). Besides, its molar mass is beneficially less than 5 kg·mol$^{-1}$, to ensure a high grafting density on substrate 100.

Step S16 of FIG. 2F then consists in removing first layer 110 and spacers 130 made of sacrificial material selectively with respect to substrate 100, to the first polymer and to second polymer 150 grafted on to the substrate. Second polymer 150 grafted on to the surface of spacers 130 is eliminated at the same time as spacers 130. At the end of step S16, only neutralisation layer 220 and patterns of the second polymer then remain on substrate 100. These patterns have the shape and dimensions of bottoms 112 of cavities 111 after the step of forming spacers 130 (cf. FIGS. 2O-2D; reduction of width W' of cavities 111). They constitute guiding patterns 210 of chemical guiding structure 200.

Guiding patterns 210 of FIG. 2F beneficially have a pitch $L_s$ which is substantially equal to an integer multiple of natural period $L_0$ ($L_s = n*L_0$, where n is a non-zero natural integer). Pitch $L_s$ is the distance which separates the edge of a guiding pattern 210 and the same edge of next guiding pattern 210, for example the two left edges (or which separates the centers of two consecutive guiding pattern 210). Pitch $L_s$ is here equal to period P of cavities 111 (cf. FIG. 2B).

In this first embodiment, guiding patterns 210 are separated from neutralisation layer 220 by bare regions of the surface of substrate 100. In these regions, created by the removal of spacers 130, the chemical affinity with respect to the block copolymer is defined by substrate 100. Substrate 100 may be comprised of a material having a preferential affinity for one of the copolymer blocks which is different to that of guiding patterns 210, or on the contrary an equivalent affinity for each block of the copolymer, like neutralisation layer 220.

The removal of step S16 can be performed using a wet process in a single operation if the sacrificial material of first layer 110 and the sacrificial material of spacers 130 are identical or, at minimum, sensitive to the same etching solution. The etching solution is, for example, a solution of hydrofluoric acid (HF) when first layer 110 and spacers 130 are made of $SiO_2$.

The elimination of first layer 110 and of spacers 130 may also be performed in two successive operations. The sacrificial materials and the etching solutions are then necessarily different (for example HF for $SiO_2$ and $H_3PO_4$ for $Si_3N_4$).

Step S16 of removing first layer 110 and spacers 130 is beneficially followed by rinsing using solvent (water, PGMEA, etc.), to eliminate the etching residues.

In an alternative embodiment of the method, not represented in the figures, the second polymer solution is deposited in step S15 with overthickness on first layer 110. Second polymer 150 is then also grafted on first layer 110 made of sacrificial material. To provide access to the etching solution of first layer 110 and of spacers 130, it may be necessary beforehand to remove second polymer 150 grafted on to first layer 110. This removal can then be performed during a so-called planarisation step, by means of a plasma (for example based on CO, $O_2$, $CO_2$, $H_2$, $N_2$, etc.), with an etch-stop on first layer 110 (by detection of first layer 110 through the use of reflectometry).

FIGS. 4A to 4G represent steps S21 to S27 of the method for forming a chemical guiding structure, according to a second embodiment of the invention.

In this second embodiment, the order in which guiding patterns 210 and neutralisation layer 220 are formed is reversed. The manner in which guiding patterns 210 made of the second polymer are formed also differs from the first embodiment. Rather than locate the grafting of second polymer 150 using a mask (cf. FIG. 2E), the second polymer can be grafted or cross-linked over a wide area of the substrate, and then patterned using a mask comprising spacers.

Steps S21 to S24 concern the formation of the spacers.

During a first step S21 illustrated by FIG. 4A, mesa-shaped patterns 300, commonly called "mandrels", are formed on substrate 100, for example by deposition of a layer of sacrificial material and patterning of the layer by photolithography. The sacrificial material of mandrels 300 is for example a carbonaceous material deposited by centrifugation ("Spin On Carbon", SOC). Mandrels 300 beneficially have a pitch $L_s$ substantially equal to an integer multiple of natural period $L_0$ of the block copolymer ($L_s=n*L_0\pm10\%$, where n is a non-zero natural integer), and in an embodiment between 60 nm and 140 nm.

Then, in step S22 of FIG. 4B, a layer 301 of second polymer 150 is formed on substrate 100 and mandrels 300. In this case, second polymer 150 can be a graftable or cross-linkable material. Layer 301 of second polymer 150 can be formed in the manner described above in relation with FIG. 2A and with neutralisation layer 220 made of first polymer 140: deposition of a solution by centrifugation, followed by grafting/cross-linking by annealing or cross-linking by UV, followed by rinsing. Layer 301 of second polymer 150 then covers the entire free surface of substrate 100 and of mandrels 300. It is in an embodiment of constant thickness (2-15 nm).

In S23 (cf. FIG. 4C), a layer 302 made of sacrificial material (e.g. $SiO_2$, $SiO_xN_y$, $Al_2O_3$, $HfO_2$, etc.) is deposited in a conformal manner (e.g. PLD, PEALD) on layer 301 of second polymer 150. The thickness of sacrificial material layer 302 is constant and less than 12.5 nm.

In next step S24 (cf. FIG. 4D), sacrificial material layer 302 is etched selectively with respect to second polymer 150. This etching is anisotropic, in a direction perpendicular to the surface of substrate 100, so as to eliminate the horizontal portions of sacrificial material layer 302, and retain only its vertical portions, positioned against the sides of mandrels 300. A dry etching technique is in an embodiment used in step S24, for example a fluorine-based ($F_2$) plasma etching.

The vertical portions of sacrificial material layer 302 constitute spacers 311. Spacers 311 are therefore protruding patterns grouped in pairs, and arranged either side of mandrels 300 (only two pairs of spacers are represented in FIG. 4D). The section and dimensions of spacers 311, in a plane parallel to substrate 100, correspond to those of guiding patterns 210 which it is sought to produce. All of spacers 311 constitute an etching mask 310.

Second polymer 150 is in an embodiment a cross-linkable material or a graftable material which is insensitive to plasma, used if applicable to deposit sacrificial material layer 302 (PECVD) (FIG. 4C) and/or to etch anisotropically this same layer 302 (FIG. 4D). This graftable material can, in particular, be the polystyrene homopolymer (h-PS). Cross-linkable polymers such as X-PS have the benefit of being more resistant than graftable polymers. Conversely, they are more difficult to use, since it is more difficult to produce, by centrifugation, a uniform film of low thickness (lower than 10 nm).

With reference to FIG. 4E, the method then comprises a step S25 of etching of second polymer layer 301 through the spacers of mask 310, until substrate 100 is reached. The etching, which is anisotropic, can be performed by means of a plasma, for example an oxygen-based (02) plasma. This step S25 leads to spacer patterns 311 being transferred into second polymer layer 301; in other words to a number of guiding patterns 210 identical to the number of spacer patterns 311 in mask 310. Mandrels 300 made of carbonaceous material are then beneficially eliminated during this same step S25. Substrate 100 is in an embodiment insensitive to etching (or protected by a layer insensitive to etching).

Width W (measured in the section plane of FIGS. 4A-4G) is the smallest dimension of spacers 311, which is commonly called the "critical dimension". It determines the width of guiding patterns 210 of chemical guiding structure 200 (cf. FIG. 4E). Critical dimension W of spacers 311—and therefore of guiding patterns 210—is in this case less than 12.5 nm, so as to be able to assemble new-generation block copolymers called "high-X".

Beneficially, critical dimension W of spacers 311 is further substantially equal to half natural period $L_0$ of the block copolymer ($W=L_0/2\pm10\%$), in order to minimise the number of defects of the copolymer blocks organisation. Distance D1 which separates two spacers of a given pair, or in other words the width of mandrels 300 (cf. FIGS. 4D-4E), is substantially equal to an odd number of half natural period $L_0/2$ ($D1=n1*L_0/2\pm10\%$, with n1 an odd natural integer), for example equal to $3*L_0/2$. Distance D2 which separates two consecutive pairs of spacers 311 is substantially equal to an odd number of half natural period $L_0/2$ (D2=n2*$L_0$/2±10%, with n2 an odd natural integer), for example equal to 3*$L_0$/2. Pitch $L_s$ of mandrels (cf. FIG. 4A) or of spacer pairs (cf. FIG. 4E) is therefore equal to an integer multiple of natural period $L_0$ of the block copolymer ($L_s$=D1+D2+2W=n1*$L_0$/2+ n2*$L_0$/2+2*$L_0$/2=n*$L_0$, where n is a non-zero natural integer, n1 and n2 are odd natural integers). The edge to edge distance (or center to center distance) between two consecutive spacers 311 is also equal to an integer multiple of natural period $L_0$ of the block copolymer (D1+W=(n1+1)*$L_0$/2 et D2+W=(n2+1)*$L_0$/2).

Next step S26, illustrated by FIG. 4F, consists in grafting first polymer 140 on to substrate 100 to form neutralisation layer 220. First polymer 140 is grafted through spacers 311 in one or more regions without guiding patterns 210, and beneficially over the entire surface of substrate 100 outside guiding patterns 210. Step S26 of FIG. 4F is in an embodiment accomplished in the manner described in relation with FIG. 2E (step S15).

Finally, in step S27 of FIG. 4G, spacers 311 made of sacrificial material are removed selectively with respect to substrate 100 and to the first and second polymers, so as to expose guiding patterns 210. Spacers 311 can be removed by wet etching (for example HF in the case of spacers made of $SiO_2$).

When second polymer 150 is a cross-linkable material, the removal of spacers 311 (step S27) can also take place before the grafting of first polymer 140 (step S26). Indeed, guiding patterns 210 formed from the second polymer are not in this case affected by the grafting of the first polymer (the first graftable polymer does not replace or become blended with the second cross-linkable polymer).

Chemical guiding structure 200 obtained after the method according to an embodiment the invention, and represented by FIGS. 2F and 4G, can be used in a method of directed self-assembly (DSA) of block copolymers, and more specifically in a method of chemoepitaxy, in order to generate secondary patterns of very high resolution and density.

Figure 3:
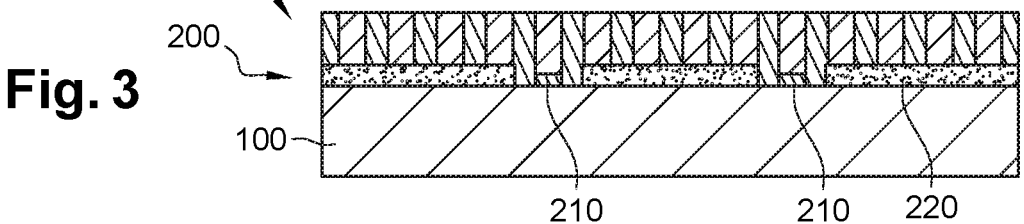
FIG. 3 represents the assembly of a block copolymer deposited on the chemical guiding structure of FIG. 2F.
Figure 5:
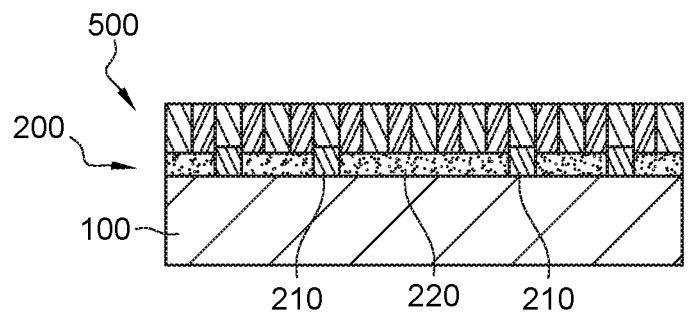
FIG. 5 represents the assembly of a block copolymer deposited on the chemical guiding structure of FIG. 4G.

With reference to FIGS. 3 and 5, this chemoepitaxy method comprises (in addition to the formation of guiding structure 200) a step of deposition of a block copolymer 500 on chemical guiding structure 200 and a step of assembly of block copolymer 500, for example by thermal annealing. Block copolymer 500 can be a diblock copolymer (two monomers) or a multiblock copolymer (more than two monomers), a blend of polymers, a blend of copolymers or, alternatively, a blend of a copolymer and of a homopolymer. The blocks of the copolymer are, after assembly, oriented perpendicularly with substrate 100, due to the presence of neutralisation layer 220.

In the embodiment of FIG. 3 (corresponding to FIGS. 2A-2F), block copolymer 500 can be of any morphology, for example lamellar, cylindrical, spherical, gyroid, etc., depending on the proportion between the monomer blocks.

In the embodiment of FIG. 5 (corresponding to FIGS. 4A-4G), block copolymer 500 is of lamellar morphology, since spacers 311 and guiding patterns 210 have a line-shaped section (in a plane parallel to substrate 100).

Block copolymer 500 is in an embodiment a "high-X" copolymer, i.e. a copolymer of natural period $L_0$ of less than 25 nm. It can be chosen from among the following materials:

PS-b-PMMA: polystyrene-block-polymethylmethacrylate, of which at least one of the two blocks is chemically modified;
PS-b-PDMS: polystyrene-block-polydimethylsiloxane;
PS-b-PLA: polystyrene-block-polylactic acid;
PS-b-PEO: polystyrene-block-ethylene polyoxide;
PS-b-PMMA-b-PEO: polystyrene-block-polymethylmethacrylate-block-ethylene polyoxide;
PS-b-P2VP: polystyrene-block-poly(2vinylpyridine);
PS-b-P4VP: polystyrene-block-poly(4vinylpyridine);
PS-b-PFS: poly(styrene)-block-poly(ferrocenyldimethylsilane);
PS-b-PI-b-PFS: poly(styrene)-block-poly(isoprene)-block-poly(ferrocenyldimethylsilane);
PS-b-P(DMS-r-VMS): polystyrene-block-poly(dimethylsiloxane-r-vinylmethylsiloxane);
PS-b-PMAPOSS: polystyrene-block-poly(methyl acrylate)POSS,
PDMSB-b-PS: poly(1,1-dimethylsilacyclobutane)-block-polystyrene,
PDMSB-b-PMMA: poly(1,1-dimethylsilacyclobutane)-block-poly(methyl methacrylate);
PMMA-b-PMAPOSS: poly(methyl methacrylate)-block-poly(methyl acrylate)POSS;
P2VP-b-PDMS: poly(2-vinylpyridine)-block-poly(dimethyl siloxane);
PTMSS-b-PLA: poly(trimethylsilylstyrene)-block-poly(D,L-lactide);
PTMSS-b-PDLA: poly(trimethylsilylstyrene)-block-poly(D-lactic acid);
PTMSS-b-PMOST: poly(trimethylsilylstyrene)-block-poly(4-methoxystyrene);
PLA-b-PDMS: poly(D,L-lactide)-block-poly(dimethylsiloxane);
PAcOSt-b-PSi2St: poly(4-acetoxystyrene)-block-poly(4-(Bis(trimethylsilyl)methyl)styrene),
1,2-PB-b-PDMS: 1,2-polybutadiene-block-poly(dimethyl siloxane);
PtBS-b-PMMA: poly(4-tert-butylstyrene)-block-poly(methyl methacrylate);
PCHE-b-PMMA: polycyclohexane-block-poly(methyl methacrylate);
MH-b-PS: maltoheptaose-block-polystyrene.

Document WO2014/165530, the content of which is incorporated by reference, gives examples of copolymer PS-b-PMMA with at least one chemically modified block. Modified copolymer PS-b-PMMA is, for example, P(S-VBCB)-b-PMMA (poly(styrene-co-2-vinylbenzocyclobutene-block-poly(methyl methacrylate)). The molar ratio between the styrene and the VBCB in the first block is typically between 90/10 and 10/90, in an embodiment between 90/10 and 30/70 and yet in another embodiment between 50/50 and 30/70.

The block copolymer typically has an average molecular mass of between 1,000 Da and 100,000 Da, in an embodiment between 5,000 Da and 50,000 Da and yet in another embodiment between 10,000 Da and 40,000 Da. In addition, the molar ratio between the first block and the second block is typically between 90/10 and 10/90, in an embodiment between 70/30 and 30/70, and yet in another embodiment 50/50 (to have a lamellar morphology).

More generally, modified copolymer PS-b-PMMA (the PS block of which is modified) can be of formula P(S-X)-b-PMMA, where X can be one of the following monomers or a combination of the following monomers: vinyl benzocyclobutene (VBCB), 1-vinylnaphthalate, 2-vinylnapthalate, 2-vinylanthracene, 9-vinylanthracene, 9-vinylphenanthrene, 4-trimethylsilylstyrene.

FIG. 6 represents an optional step S37 of the method of FIGS. 4A-4G. This step is accomplished after step S26 of FIG. 4F.

During this step S37, the chemical affinity of neutralisation layer 220 is modified locally, i.e. in a portion only of neutralisation layer 220, in order to form on the surface of substrate 100 an area 400 of preferential affinity with one of the blocks of the copolymer. Area 400 has no guiding patterns 210.

The chemical affinity of neutralisation layer 220 is preferentially modified by exposure to ultraviolet radiation (UV) 410 of wavelength λ of between 150 nm and 350 nm, for example equal to 172 nm.

To locate the chemical modification of neutralisation layer 220, a mask (not represented) can be interposed between the source of the radiation and substrate 100, which supports neutralisation layer 220. The mask exposes a first portion 220a of the neutralisation layer of which it is desired to modify the chemical affinity. Conversely, it covers guiding patterns 210 and a second portion 220b of the neutralisation layer which, on the contrary, it is desired to leave intact. In this case, the exposure can take place before or after step S27 of removing spacers 311.

As illustrated by FIG. 6, the exposure to UV radiation 410 can alternatively be performed over the entire surface of substrate 100 (i.e. full plate), without interposing any mask, and taking advantage of spacers 311. The exposure then takes place before spacers 311 are removed.

Indeed, by spacing them two-by-two at a distance of less than or equal to half wavelength λ of the UV radiation (D1≤λ/2 and D2≤λ/2; cf. FIG. 4E), spacers 311 form a filter which prevents UV radiation 410 from reaching guiding patterns 210 and second portion 220b of the neutralisation layer.

Other treatments, such as exposure to an electron beam, ion implantation or exposure to certain plasmas, can be used (in association with a mask) to modify locally the chemical affinity of neutralisation layer 220.

Figure 7:
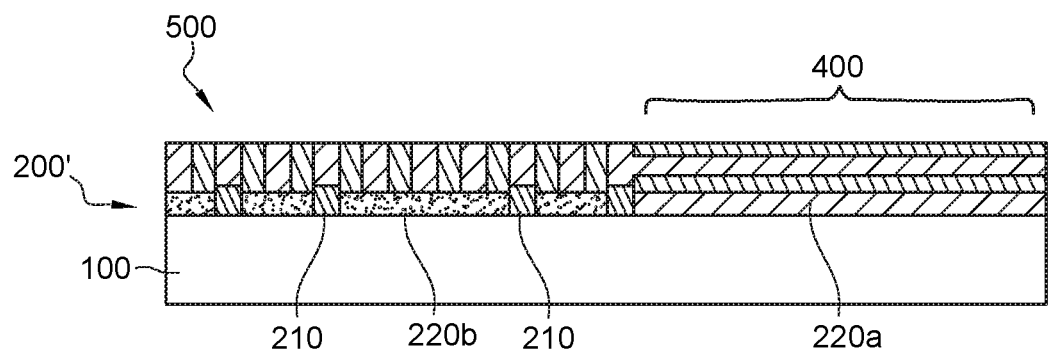
FIG. 7 represents the assembly of a block copolymer on the chemical guiding structure obtained after the step of FIG. 6.

FIG. 7 represents a guiding structure 200', obtained after the removal of spacers 311 of FIG. 6, and the assembly of block copolymer 500 on this guiding structure 200'. Guiding structure 200' comprises guiding patterns 210, first portion 220a and second portion 220b of the neutralisation layer.

During assembly, the blocks of the copolymer are not oriented perpendicularly to substrate 100 in area 400 of preferential affinity, where first portion 220a of the neutralisation layer is located, but parallel to substrate 100. No transfer of secondary patterns (after one of the phases of the copolymer is removed) can therefore take place in this area 400 of the substrate.

As mentioned above, use of spacers 130 (FIGS. 2A-2F) and 311 (FIGS. 4A-4G) to delimit guiding patterns 210 makes it possible to obtain a guiding structure compatible with "high-X" block copolymers. The width of the spacers, and therefore the critical dimension of the guiding patterns, can easily be controlled by altering the thickness of the conformal deposit. The use of spacers also enables the line edge roughness (LER) and the line width roughness (LWR) of the guiding patterns to be reduced, which leads to a higher quality assembly.

It will be appreciated that the method of formation according to the invention is not limited to the embodiments described with reference to FIGS. 2, 4 and 6, and many variants and modifications will occur to those skilled in the art. In particular, first polymer 140 and second polymer 150 could have other compositions to those described above. Similarly, other block copolymers could be used.

The chemical guiding structures which can be produced using the formation method according to the invention are not limited to juxtaposition of homopolymer guiding patterns and a neutralisation layer. Other types of patterns, with chemical affinities different to those described above, can be used. For example, chemical guiding structure 200 may be comprised of a first pattern (or set of patterns) having a preferential affinity for a block of the copolymer and of a second pattern (or set of patterns) with a preferential affinity for another block of the copolymer. The first and second polymers could then be both homopolymers.

The invention claimed is:

1. A method for forming a chemical guiding structure intended for self-assembly of a block copolymer by chemoepitaxy, the method comprising:
    forming a functionalization layer on a substrate, the functionalization layer made of a first polymer material having a first chemical affinity with respect to the block copolymer;
    forming guiding patterns on the substrate, the guiding patterns made of a second polymer material having a second chemical affinity with respect to the block copolymer, different from the first chemical affinity, wherein the guiding patterns have a critical dimension of less than 12.5 nm and are formed by means of a mask comprising spacers, said mask comprising spacers being obtained by first forming a topographical pattern and then forming said spacers on side walls of the topographical pattern.

2. The method according to claim 1, wherein the first chemical affinity is equivalent for each of the copolymer blocks, and wherein the second chemical affinity is preferential for one of the blocks of the copolymer.

3. The method according to claim 1, further comprising:
    depositing a layer of sacrificial material on the functionalization layer;
    forming cavities in the layer of the sacrificial material and in the functionalization layer, said cavities extending up to the substrate, each cavity comprising a bottom and side walls;
    forming the spacers against the side walls of the cavities;
    grafting the second polymer material on to the bottoms of the cavities between the spacers;
    and
    removing the spacers and the layer of sacrificial material.

4. The method according to claim 1, comprising:
    forming a layer of the second polymer material on the substrate;
    forming the spacers on the layer of the second polymer material;
    etching the layer of the second polymer material through the spacers to form the guiding patterns;
    grafting the first polymer material on to the substrate outside the guiding patterns to form the functionalization layer; and
    removing the spacers.

5. The method according to claim 4, further comprising a step of modification of the first chemical affinity in a portion only of functionalization layer by exposure to ultraviolet radiation.

6. The method according to claim 5, wherein:
    the exposure to ultraviolet radiation is performed over the entire surface of the substrate before step of removing the spacers;
    the ultraviolet radiation has a wavelength (λ) comprised between 150 nm and 350 nm; and
    the spacers are separated two-by-two by a distance less than or equal to half the wavelength.

7. The method according to claim 1, wherein the critical dimension of the guiding patterns is further substantially equal to half the natural period of the block copolymer.

8. A chemoepitaxy method comprising:
forming a chemical guiding structure on the substrate using a method according to claim 1;
depositing the block copolymer on the chemical guiding structure; and
assembling the block copolymer.

9. The method according to claim 8, wherein the block copolymer is a copolymer of natural period of less than 25 nm.

10. The method according to claim 1, wherein said spacers are formed by successively:
performing a conformal deposition of a layer of sacrificial material on the topographical pattern, and
anisotropically etching the layer of sacrificial material to form the spacers on the side walls of the topographical pattern.

\* \* \* \* \*